(12) United States Patent
Li et al.

(10) Patent No.: US 12,550,390 B2
(45) Date of Patent: Feb. 10, 2026

(54) TRENCH ISOLATION FOR BACKSIDE CONTACT FORMATION

(71) Applicant: INTERNATIONAL BUSINESS MACHINES CORPORATION, Armonk, NY (US)

(72) Inventors: Juntao Li, Cohoes, NY (US); Ruilong Xie, Niskayuna, NY (US); Kisik Choi, Watervliet, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 18/351,523

(22) Filed: Jul. 13, 2023

(65) Prior Publication Data

US 2025/0022913 A1    Jan. 16, 2025

(51) Int. Cl.
*H10D 62/10*        (2025.01)
*H01L 23/48*        (2006.01)
(Continued)

(52) U.S. Cl.
CPC ......... *H10D 62/116* (2025.01); *H01L 23/481* (2013.01); *H10D 30/014* (2025.01); *H10D 30/43* (2025.01); *H10D 30/6729* (2025.01); *H10D 30/6735* (2025.01); *H10D 30/6757* (2025.01); *H10D 62/121* (2025.01);
(Continued)

(58) Field of Classification Search
CPC ... H01L 23/481; H01L 23/5286; H10D 30/01; H10D 30/014; H10D 30/019–0198; H10D 30/501–509; H10D 30/6729; H10D 30/6735; H10D 30/674; H10D 30/6757; H10D 62/113; H10D 62/116; H10D 62/121; H10D 64/251; H10D 84/01; H10D 84/013; H10D 84/0149; H10D 84/0151; H10D 84/0186; H10D 84/0188; H10D 84/02; H10D 84/032; H10D 84/035; H10D 84/05; H10D 84/07; H10D 84/08; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/85
See application file for complete search history.

(56) References Cited

U.S. PATENT DOCUMENTS 7,402,866 B2    7/2008  Liang
8,390,089 B2    3/2013  Chen
(Continued)

*Primary Examiner* — Cheung Lee
(74) *Attorney, Agent, or Firm* — Yuanmin Cai

(57) ABSTRACT

Embodiments of present invention provide a semiconductor structure. The semiconductor structure includes a trench isolation between a first source/drain region of a first transistor and a second source/drain region of a second transistor, wherein the trench isolation includes an upper portion and a lower portion; the lower portion has a first lower sidewall and a second lower sidewall that intersects with the first lower sidewall to form a pointy bottom of the trench isolation; a first lower conformal liner at the first lower sidewall and a second lower conformal liner at the second lower sidewall; and the first and second lower conformal liners pinch off at the pointy bottom. A method of forming the same is also provided.

19 Claims, 17 Drawing Sheets

(51) Int. Cl.
 *H10D 30/01* (2025.01)
 *H10D 30/43* (2025.01)
 *H10D 30/67* (2025.01)
 *H10D 84/01* (2025.01)
 *H10D 84/83* (2025.01)

(52) U.S. Cl.
 CPC ....... *H10D 84/013* (2025.01); *H10D 84/0149* (2025.01); *H10D 84/0151* (2025.01); *H10D 84/83* (2025.01)

(56) References Cited

U.S. PATENT DOCUMENTS

| | | | |
|---|---|---|---|
| 9,230,861 B2 | 1/2016 | Chetlur | |
| 10,896,958 B2 | 1/2021 | Goktepeli | |
| 10,985,057 B2 | 4/2021 | Jourdain | |
| 11,018,179 B2 | 5/2021 | Wei | |
| 11,430,909 B2 | 8/2022 | Sung | |
| 11,532,556 B2 | 12/2022 | Huang | |
| 2007/0296002 A1 | 12/2007 | Liang | |
| 2012/0025199 A1 | 2/2012 | Chen | |
| 2014/0099772 A1 | 4/2014 | Chetlur | |
| 2018/0166293 A1* | 6/2018 | Tsai | H01L 21/3081 |
| 2019/0287971 A1* | 9/2019 | Lee | H10D 30/024 |
| 2020/0091294 A1 | 3/2020 | Goktepeli | |
| 2020/0152508 A1 | 5/2020 | Jourdain | |
| 2020/0303435 A1 | 9/2020 | Wei | |
| 2021/0036179 A1 | 2/2021 | Sung | |
| 2021/0111115 A1 | 4/2021 | Patrick | |
| 2021/0134721 A1 | 5/2021 | Chiang | |
| 2021/0202385 A1 | 7/2021 | Huang | |
| 2021/0305252 A1 | 9/2021 | Chiang | |
| 2021/0305381 A1 | 9/2021 | Chiang | |
| 2021/0351303 A1 | 11/2021 | Ju | |
| 2021/0376071 A1 | 12/2021 | Liu | |
| 2021/0376093 A1 | 12/2021 | Chu | |
| 2021/0408246 A1 | 12/2021 | Ganguly | |
| 2022/0375860 A1 | 11/2022 | Huang | |
| 2023/0065318 A1 | 3/2023 | Wei-Han | |
| 2024/0274594 A1* | 8/2024 | Surthi | H10D 89/10 |

* cited by examiner

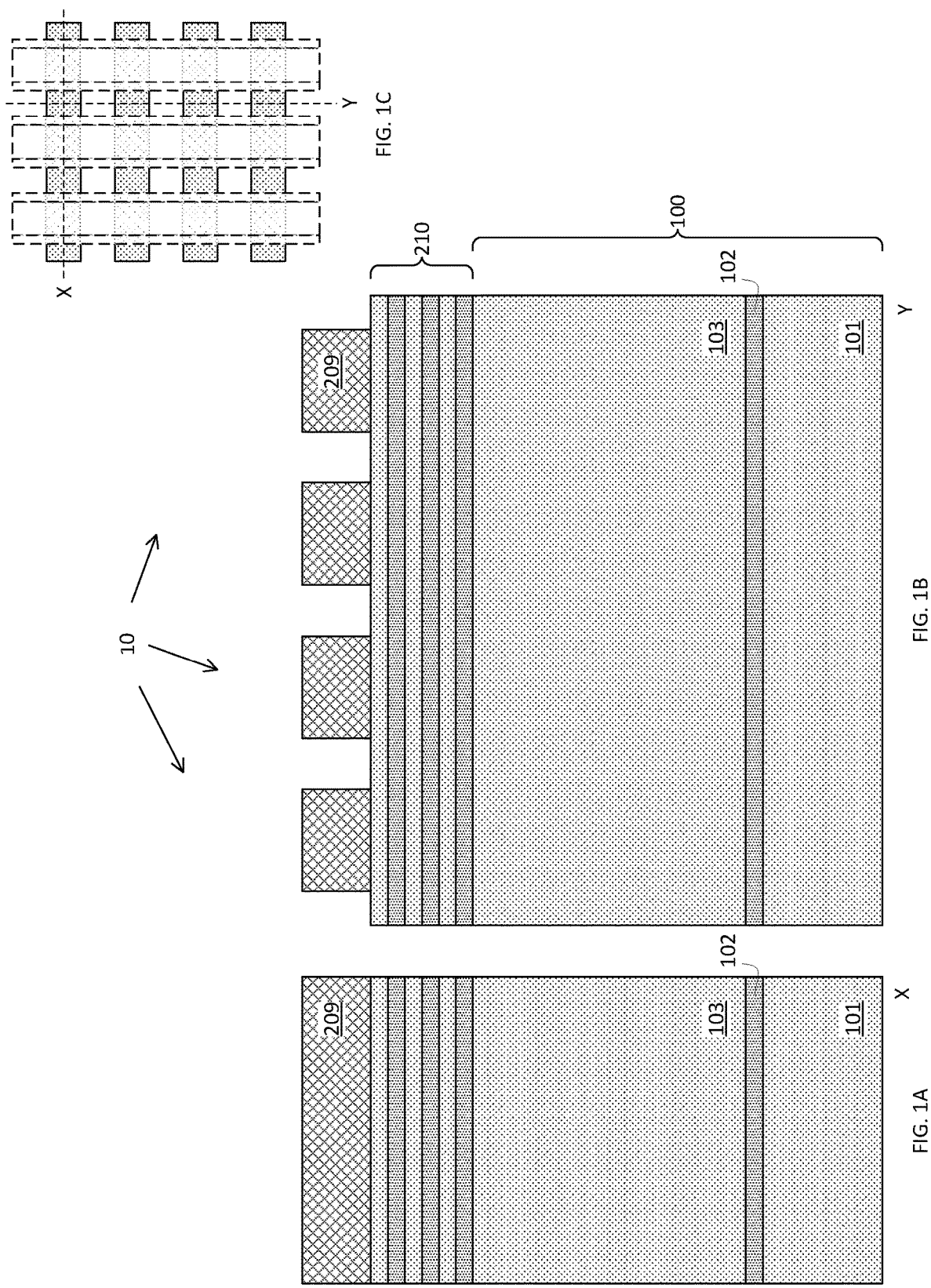

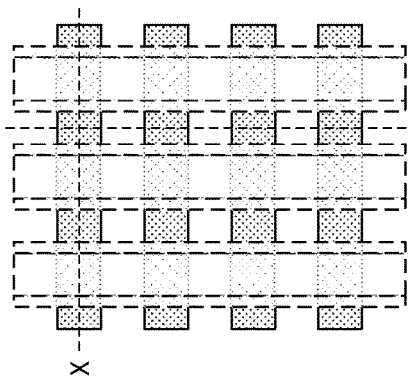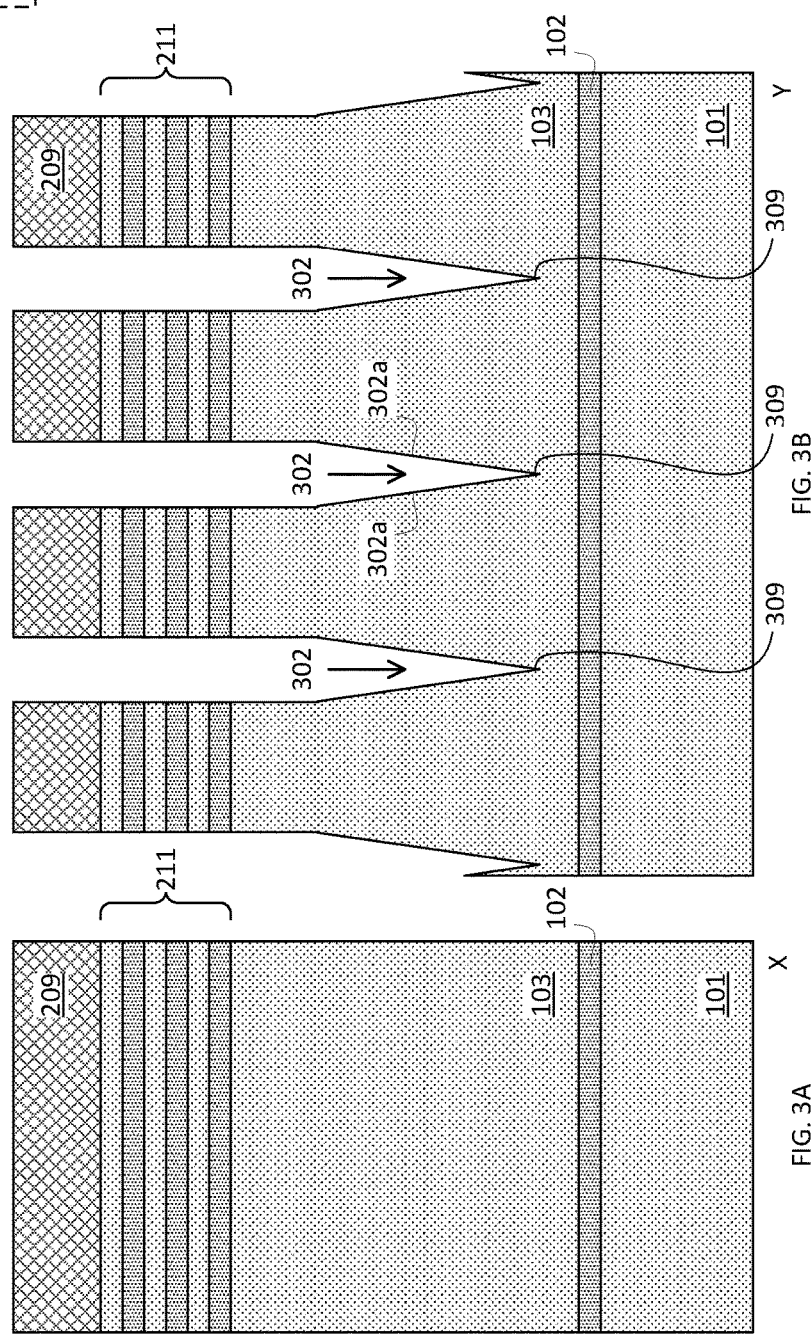

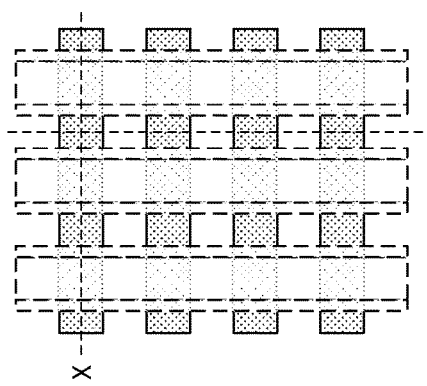
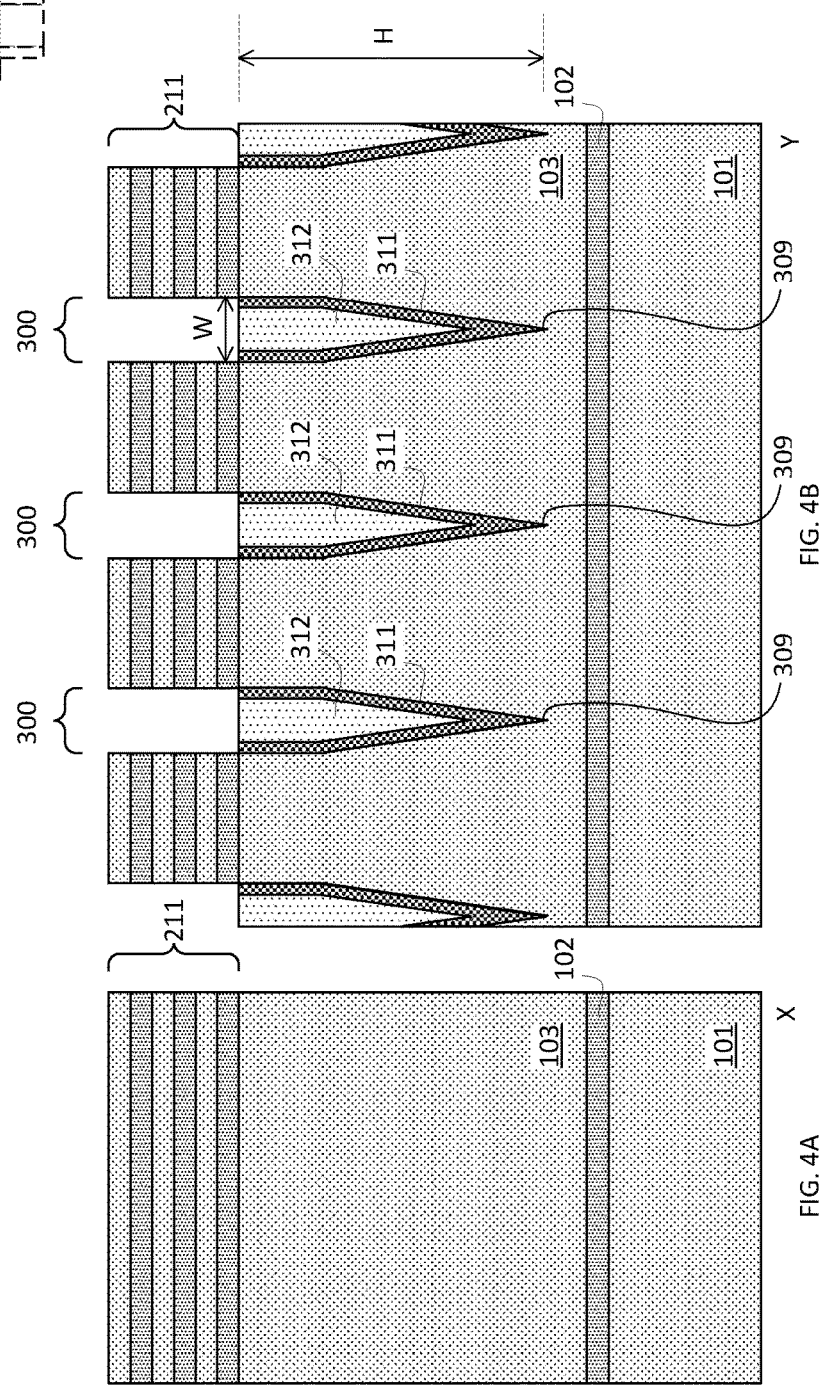
FIG. 4A
FIG. 4B
FIG. 4C

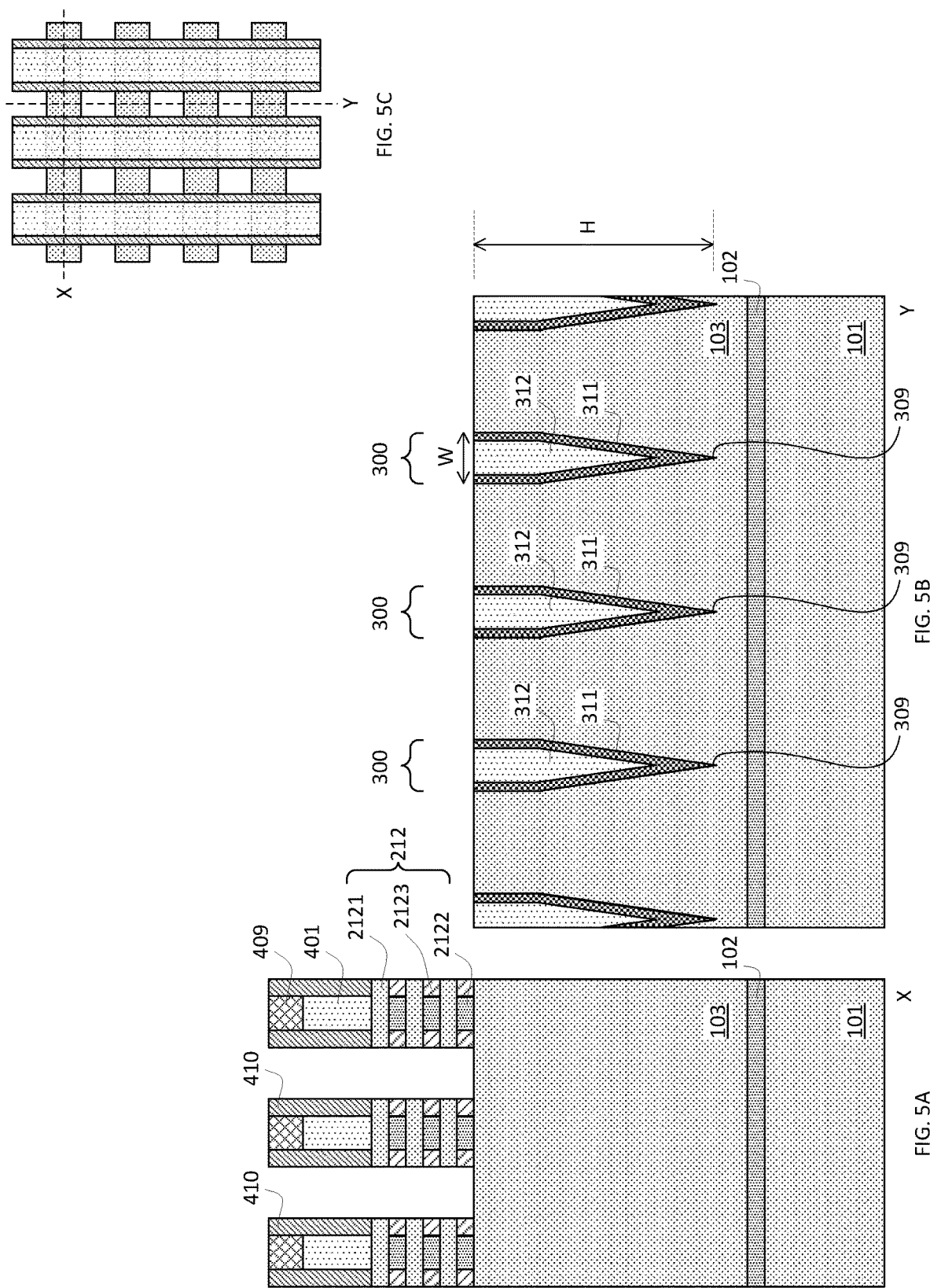

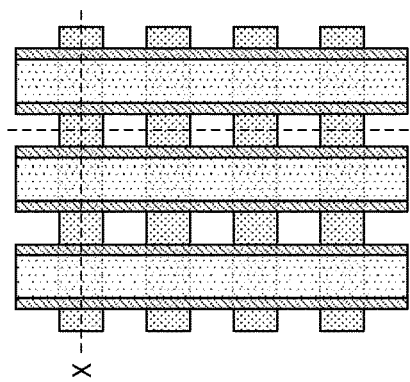
FIG. 6C
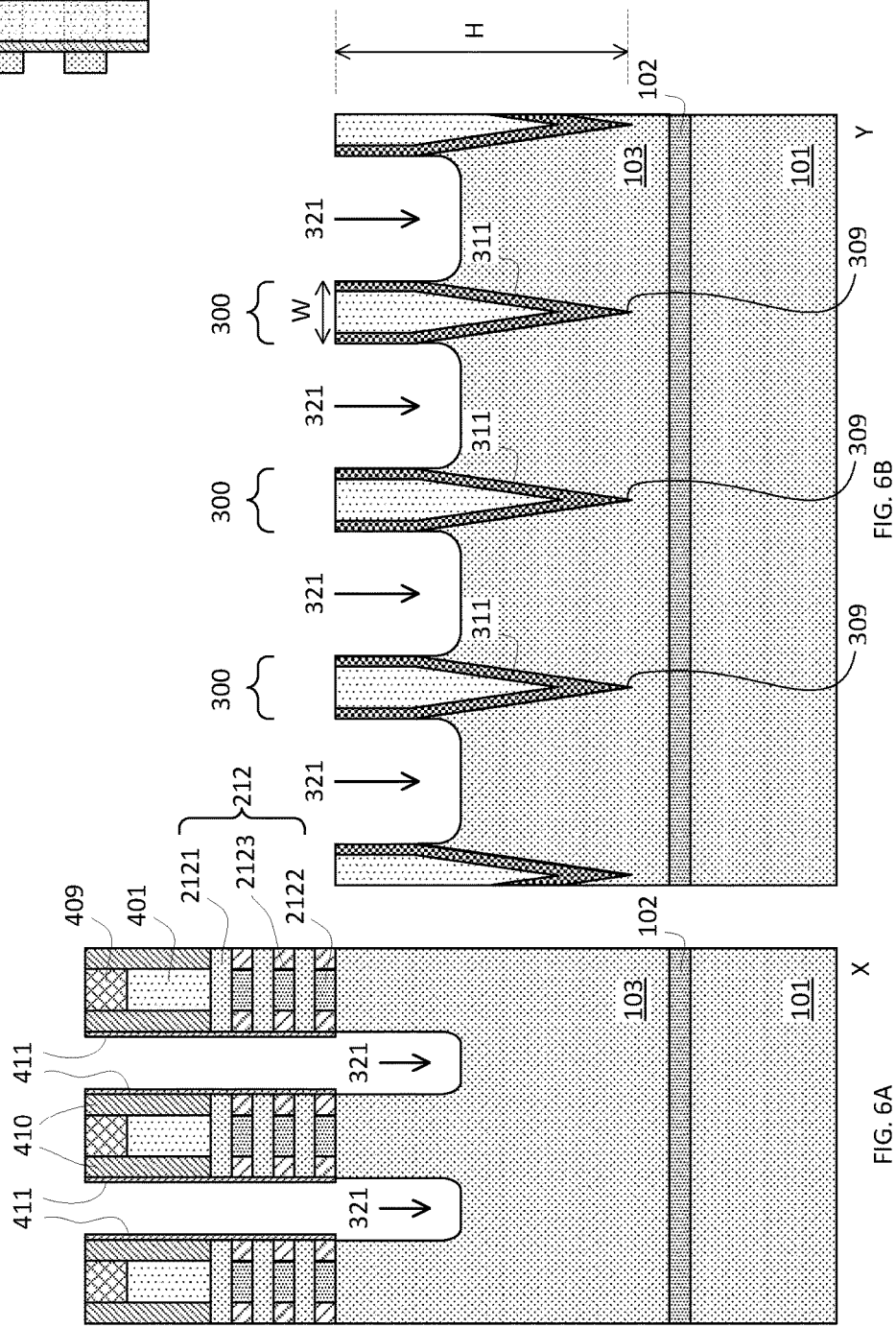
FIG. 6A
FIG. 6B

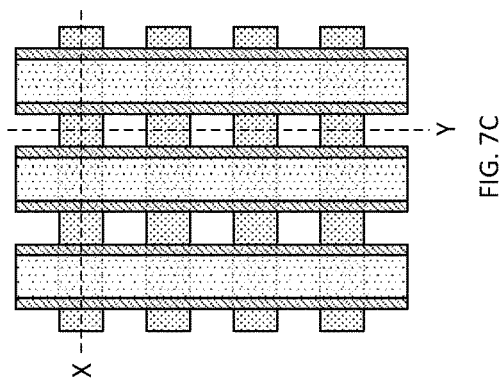
FIG. 7C
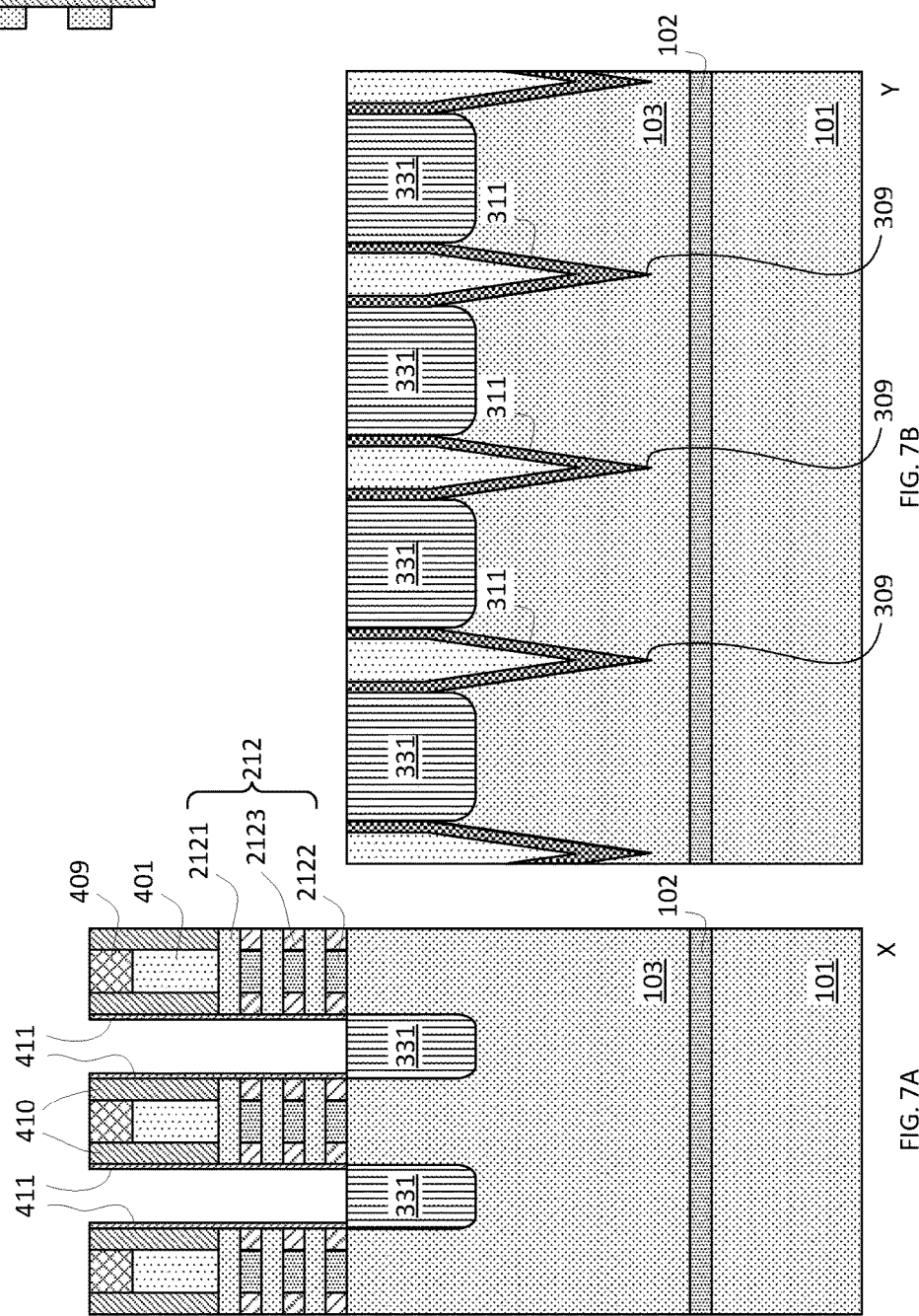
FIG. 7B
FIG. 7A

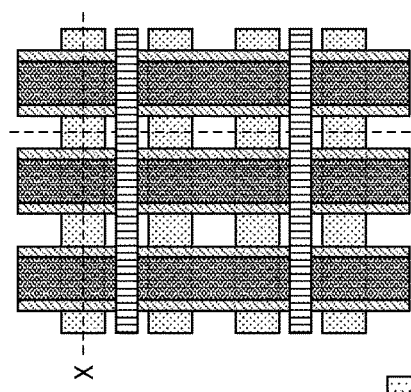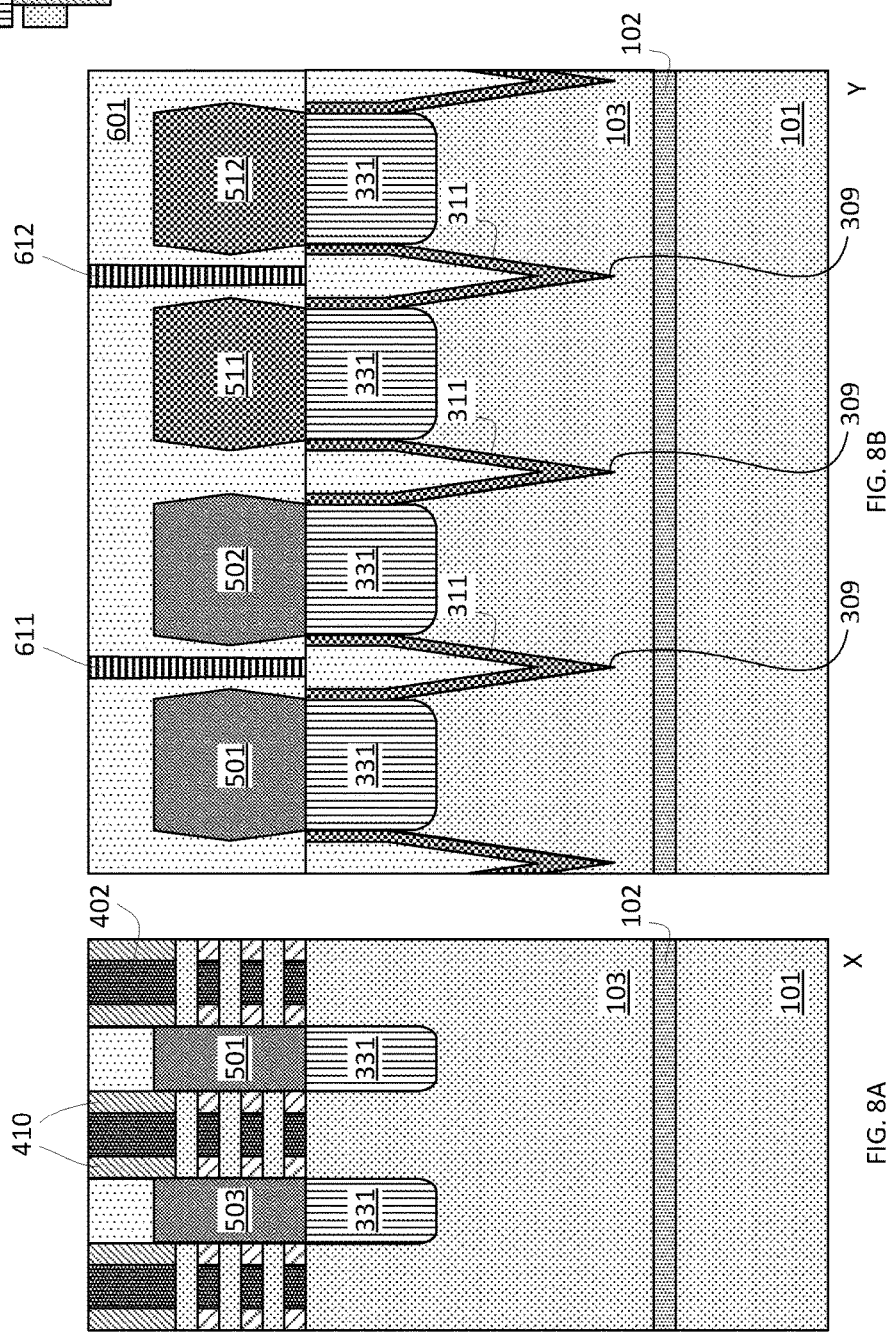

TRENCH ISOLATION FOR BACKSIDE CONTACT FORMATION

BACKGROUND

The present application relates to manufacturing of semiconductor integrated circuits. More particularly, it relates to a method of forming shallow trench isolation for backside contact and the structure formed thereby.

A semiconductor device and/or structure typically includes front-end-of-line (FEOL) devices such as transistors, middle-of-line (MOL) contacts such as contacts to transistors, and back-end-of-line (BEOL) structures such as interconnect structures. Recent advancement in semiconductor device manufacturing has led to the introduction of backside contact and backside interconnect at the backside of the FEOL devices. Backside contact and backside interconnect are normally formed from the backside of the FEOL devices, by removing most of the substrate upon which the FEOL devices are formed, after the chip or wafer under manufacturing is flipped upside-down.

To assist the formation of backside contacts to the FEOL devices, contact placeholders are normally formed during a frontside processing step. These contact placeholders are then replaced to form a portion of the actual backside contacts during a backside processing step. However, when the tip-to-tip (T2T) spacing between two neighboring transistors becomes smaller, there is an increased risk that a short may happen between the backside contacts of the two transistors, resulting in undesirable consequences particularly when the two transistors carry opposite charges, that is when one transistor is a p-type transistor carrying positive charges and the other transistor is an n-type transistor carrying negative charges.

SUMMARY

Embodiments of present invention provide a semiconductor structure. The semiconductor structure includes a trench isolation between a first source/drain region of a first transistor and a second source/drain region of a second transistor, where the trench isolation includes an upper portion and a lower portion; the lower portion has a first lower sidewall and a second lower sidewall that intersects with the first lower sidewall to form a pointy bottom of the trench isolation; a first lower conformal liner at the first lower sidewall and a second lower conformal liner at the second lower sidewall; and the first and second lower conformal liners pinch off at the pointy bottom. The pointy lower portion of the trench isolation helps creating backside contacts with larger contact areas, while in the meantime provide insulation between backside contacts of neighboring nanosheet transistors.

According to one embodiment, the semiconductor structure further includes a first and a second backside contact directly connected to the first and the second source/drain region of the first and the second transistor respectively, the first and the second backside contact are formed directly next to the trench isolation to follow a contour of the trench isolation and self-aligned to the first and the second source/drain region.

In one embodiment, the first backside contact includes a top portion and a bottom portion, the bottom portion has a trapezoidal shape with a narrow base at a top of the trapezoidal shape and a wider base at a bottom of the trapezoidal shape.

In another embodiment, the upper portion of the trench isolation has a first upper sidewall and a first upper conformal liner that respectively extend into the first lower sidewall and the first lower conformal liner, and a second upper sidewall and a second upper conformal liner that respectively extend into the second lower sidewall and the second lower conformal liner, wherein a linear slope of the first upper sidewall is steeper than a linear slope of the first lower sidewall and a linear slope of the second upper sidewall is steeper than a linear slope of the second lower sidewall.

In yet another embodiment, the first and second upper conformal liners and the first and second lower conformal liners are made of silicon-nitride (SiN) and the trench isolation further includes a dielectric filler of silicon-oxide (SiO2) between the first and second upper conformal liners and between the first and second lower conformal liners.

According to one embodiment, the semiconductor structure further includes a gate-cut trench directly above the trench isolation between the first and the second transistor, wherein the first and the second transistor are a same type of transistor.

According to another embodiment, the semiconductor structure further includes a backside power rail (BSPR) directly below the trench isolation, the BSPR being connected to both the first and the second source/drain region of the first and the second transistor.

In one embodiment, the pointy bottom of the trench isolation is in contact with a backside interlevel dielectric (BILD) layer and the first transistor is a p-type transistor and the second transistor is an n-type transistor.

In another embodiment, the trench isolation has a depth ranging from about 30 nm to about 300 nm.

Embodiments of present invention further provide a method. The method includes forming a trench isolation in a substrate; forming a first and a second placeholder in the substrate adjacent to the trench isolation, wherein the first and the second placeholder have a depth less than a depth of the trench isolation; forming a first and a second source/drain region of a first and a second transistor directly above the first and the second placeholder respectively; selectively removing the substrate underneath the first and the second placeholder; selectively removing the first and the second placeholder to create a first and a second opening that expose the first and the second source/drain region of the first and the second transistor and expose the trench isolation; and filling the first and the second opening with a conductive material to form a first and a second backside contact that follow a contour of the trench isolation. By forming the trench isolation, the first and the second backside contact may be formed to be self-aligned with their respective source/drain region.

In one embodiment, forming the trench isolation includes performing a first etching of the substrate to create a first recess having a first set of sidewalls with a first linear slope; performing a second etching of the substrate, through the first recess, to create a second recess below the first recess, the second recess having a second set of sidewalls extended from the first set of sidewalls, the second set of sidewalls having a second linear slope and intersecting with each other to form a pointy bottom of the second recess.

In another embodiment, forming the trench isolation further includes depositing a conformal liner lining the first and the second recesses, resulting the conformal liner to pinch off at the pointy bottom of the second recess.

According to one embodiment, the method further includes forming a backside power rail (BSPR) in contact with the first and the second backside contact at a first side and a second side of the trench isolation, the BSPR being directly underneath the trench isolation and being formed from a backside of the substrate.

BRIEF DESCRIPTION OF THE DRAWINGS

The present invention will be understood and appreciated more fully from the following detailed description of embodiments of present invention, taken in conjunction with accompanying drawings of which:

FIGS. 1A, 1B, and 1C to FIGS. 16A, 16B, and 16C are demonstrative illustrations of different cross-sectional views and simplified top views of a semiconductor structure in various steps of manufacturing thereof according to embodiments of present invention.

Figure 2C:
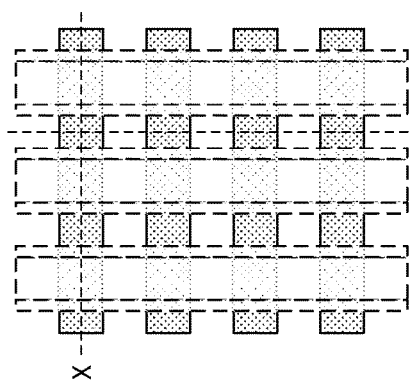

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A, 1B, and 1C are demonstrative illustrations of different cross-sectional views and a top view of a semiconductor structure in a step of manufacturing thereof according to one embodiment of present invention. More specifically, FIG. 1A illustrates a cross-sectional view of the semiconductor structure along a dashed line X as illustrated in FIG. 1C. In other words, the cross-sectional view in FIG. 1A is made across the gate in a direction along the length of the gate. FIG. 1B illustrates a cross-sectional view of the semiconductor structure along a dashed line Y as illustrated in FIG. 1C. In other words, the cross-sectional view in FIG. 1B is made across the S/D region in a direction along the width of the gate. FIG. 1C is a simplified top view of the semiconductor structure. More particularly, for the sake of clarity, elements such as, for example, nanosheets, gates, S/D regions, and/or other key elements that are yet to be formed or covered by other elements may be selectively illustrated in FIG. 1C. On the other hand, elements such as dielectric cap layer, sidewall spacers, etc. may not necessarily be illustrated in order to avoid overcrowding the drawing, and to the extent that their omitting from FIG. 1C does not hinder the description of embodiments of present invention, although some of these elements do exist as well.

Similarly, FIGS. 2A, 2B, and 2C to FIGS. 16A, 16B, and 16C illustrate cross-sectional reviews and simplified top views of the semiconductor structure, at various manufacturing stages, in manners similar and/or corresponding to FIGS. 1A, 1B, and 1C.

Reference is made back to FIGS. 1A, 1B, and 1C. More specifically, embodiments of present invention provide forming a semiconductor structure 10 by receiving or providing a semiconductor substrate 100. The semiconductor substrate 100 may include a silicon (Si) substrate 101, a silicon-germanium (SiGe) layer 102 on top of the Si substrate 101, and a Si layer 103 on top of the SiGe layer 102. The SiGe layer 102 may have a germanium (Ge) concentration level around, for example, 30% and may thus be referred to as a SiGe30 layer 102 as well. The SiGe layer 102 may serve as an etch-stop layer later during a backside processing step. In one embodiment, the semiconductor substrate 100 may be a silicon-on-insulator (SOI) layer to include a dielectric layer as an etch-stop layer.

Embodiments of present invention further provide proceeding to form one or more transistor structures on top of the semiconductor substrate 100. As a non-limiting example, and for the sole purpose of illustration and description of embodiments of present invention, hereinafter it is assumed that one or more nanosheet transistors are to be formed on top of the semiconductor substrate 100, although embodiments of present invention may be applied to other types of transistors such as, for example, fin-type transistors and/or planar transistors. The one or more nanosheet transistors may be, for example, part of a logic circuitry.

In order to form one or more nanosheet transistors, embodiments of present invention provide forming a stack of raw nanosheets 210 on top of the semiconductor substrate 100. The stack of raw nanosheets 210 may include a set of raw nanosheets separated by a set of raw sacrificial sheets. Embodiments of present invention provide further forming a hard mask 209 on top of the stack of raw nanosheets 210.

The hard mask 209 may represent a pattern of the one or more nanosheet transistors to be formed.

Figure 2B:
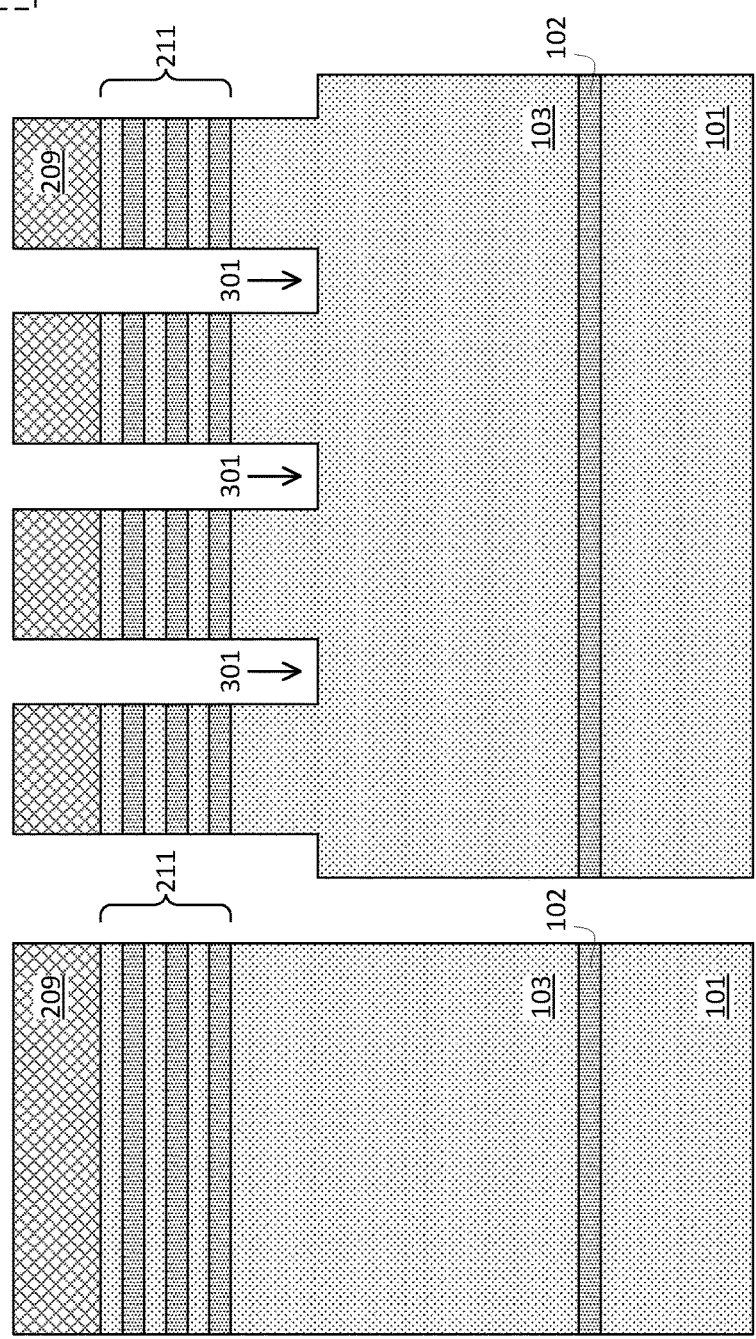
Figure 2A:
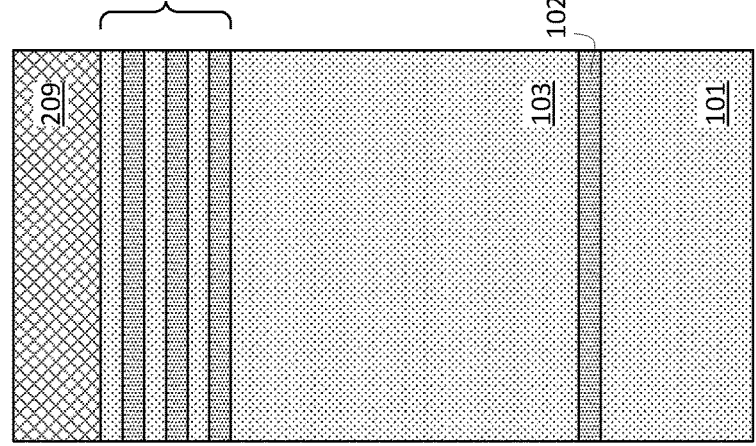

FIGS. 2A, 2B, and 2C are demonstrative illustrations of different cross-sectional views and a simplified top view of the semiconductor structure 10 in a step of manufacturing thereof according to one embodiment of present invention. Following the step illustrated in FIGS. 1A, 1B, and 1C, embodiments of present invention provide patterning the stack of raw nanosheets 210 into multiple stacks of nanosheets 211 by transferring the pattern of the hard mask 209 into the stack of raw nanosheets 210 through recessing, thereby creating one or more first recesses 301 between the multiple stacks of nanosheets 211. The one or more first recesses 301 may be created through a selective etching process and may have a relatively straight profile. In other words, sidewalls of the one or more first recesses 301 may be substantially vertical or slightly sloped to have a steep slope. The one or more first recesses 301 may be made partially into the Si layer 103 of the semiconductor substrate 100.

FIGS. 3A, 3B, and 3C are demonstrative illustrations of different cross-sectional views and a simplified top view of the semiconductor structure 10 in a step of manufacturing thereof according to one embodiment of present invention. Following the step illustrated in FIGS. 2A, 2B, and 2C, embodiments of present invention provide further etching the Si layer 103 from the one or more first recesses 301 to create one or more second recesses 302 that extend from the one or more first recesses 301. The one or more second recesses 302 may be etched to have a triangle shape to have a pointy bottom 309. In one embodiment, the one or more second recesses 302 may be created through a plasma dry etch process. The plasma dry etch process may create two sidewalls 302a, in the Si layer 103, that merge or intersect at the pointy bottom 309. In one embodiment, the sidewalls 302a of the one or more second recesses 302 may have a linear slope that is shallower than the slope of the sidewalls of the one or more first recesses 301. In other words, the sidewalls of the one or more first recesses 301 may have a linear slope that is steeper than the linear slope of the sidewalls of the one or more second recesses 302.

FIGS. 4A, 4B, and 4C are demonstrative illustrations of different cross-sectional views and a simplified top view of the semiconductor structure 10 in a step of manufacturing thereof according to one embodiment of present invention. Following the step illustrated in FIGS. 3A, 3B, and 3C, embodiments of present invention provide depositing a conformal liner 311 lining the one or more first recesses 301 and the one or more second recesses 302 below the one or more first recesses 301. The conformal liner 311 may be made of or may include dielectric materials such as, for example, silicon-nitride (SiN), silicon-boron carbonitride (SiBCN), silicon oxycarbonitride (SiOCN), silicon oxycarbide (SiOC), etc. and may have a thickness ranging from about 5 nm to about 20 nm, but not limited to this range. The conformal liner 311 may pinch off at the pointy bottoms 309 of the second recesses 302. The pinched off pointy bottoms 309 may provide electric insulation between bottom contacts of adjacent transistors, as being described below in more details. The conformal liner 311 may also line sidewalls of the multiple stacks of nanosheets 211.

After lining the first and second recesses 301 and 302 with the conformal liners 311, embodiments of present invention provide filling openings left in-between the conformal liners 311 in the first and second recesses 301 and 302 with a dielectric material. The dielectric material may also fill the openings between the multiple stacks of nanosheets 211.

Next, a chemical-mechanical-polishing (CMP) process may be applied to planarize a top surface of the semiconductor structure 10 until, for example, the hard mask 209 is removed and/or polished off. Following the planarization, the conformal liners 311 and the dielectric material between the conformal liners 311 may be recessed, in an etching process that is selective to the multiple stacks of nanosheets 211, down to a level that is substantially same as a level of the top surface of the Si layer 103, thereby forming one or more trench isolations 300. The one or more trench isolations 300 may have a depth H ranging from about 30 nm to about 300 nm, sufficiently deep into the Si layer 103, and include multiple dielectric fillers 312 formed between the conformal liners 311. The one or more dielectric fillers 312 may be made of or include, for example, silicon-oxide ($SiO_2$) and may be materially different from the conformal liner 311.

FIGS. 5A, 5B, and 5C are demonstrative illustrations of different cross-sectional views and a simplified top view of the semiconductor structure 10 in a step of manufacturing thereof according to one embodiment of present invention. Following the step illustrated in FIGS. 4A, 4B, and 4C, embodiments of present invention provide depositing a layer of dummy gate material on top of the multiple stacks of nanosheets 211; forming a hard mask 409 on top of the layer of dummy gate material; and patterning the layer of dummy gate material into multiple dummy gates 401. Next, a plurality of sidewall spacers 410 may be formed at sidewalls of the multiple dummy gates 401 and the multiple dummy gates 401, together with the sidewall spacers 410, may be used in a recessing process of the multiple stacks of nanosheets 211. More specifically, the multiple stacks of nanosheets 211 may be recessed into multiple sets of nanosheets 212 with spaces in-between for forming source/drain regions of the nanosheet transistors. Each of the set of nanosheets 212 may include multiple nanosheets 2121 separated by multiple sacrificial sheets 2122. An indentation process may be applied to create multiple indents at the end of the multiple sacrificial sheets 2122 and multiple inner spacers 2123 may subsequently be formed in the corresponding locations of the multiple indents.

FIGS. 6A, 6B, and 6C are demonstrative illustrations of different cross-sectional views and a simplified top view of the semiconductor structure 10 in a step of manufacturing thereof according to one embodiment of present invention. Following the step illustrated in FIGS. 5A, 5B, and 5C, embodiments of present invention provide forming a plurality of protective spacers 411 and/or liners at sidewalls of the multiple sets of nanosheets 212 and at sidewall spacers 410 of the multiple dummy gates 401. The plurality of protective spacers 411 may protect the integrity of the multiple sets of nanosheets 212, and the dummy gate structures on top thereof, from being processed during a subsequent recessing process.

Embodiments of present invention provide performing recessing of the Si layer 103 in-between the multiple dummy gates 401 to create multiple cavities 321. The multiple cavities 321 so created may have a depth that is generally less than the depth H of the trench isolations 300. For example, the depth of the multiple cavities 321 may be made comparable to or slightly deeper than the depth of the first recesses 301, therefore made mainly along the substantially vertical portion of sidewalls of the trench isolations 300. The multiple cavities 321 may be used in forming placeholders, which may be used in forming backside contacts in a backside processing step.

FIGS. 7A, 7B, and 7C are demonstrative illustrations of different cross-sectional views and a simplified top view of the semiconductor structure 10 in a step of manufacturing thereof according to one embodiment of present invention. Following the step illustrated in FIGS. 6A, 6B, and 6C, embodiments of present invention provide filling the multiple cavities 321 between the multiple dummy gates 401 with a placeholder material to form multiple placeholders 331. For example, silicon-germanium may be epitaxially grown from inside the multiple cavities 321 to form the multiple placeholders 331. The multiple placeholders 331 may have a depth that is less than the depth of the trench isolations 300. In one embodiment, a CMP process, together with a subsequent recessing process, may be applied to planarize a top surface of the multiple placeholders 331.

FIGS. 8A, 8B, and 8C are demonstrative illustrations of different cross-sectional views and a simplified top view of the semiconductor structure 10 in a step of manufacturing thereof according to one embodiment of present invention. Following the step illustrated in FIGS. 7A, 7B, and 7C, embodiments of present invention provide removing the protective spacers 411 from sidewalls of the multiple sets of nanosheets 212 and epitaxially growing source/drain regions of the nanosheet transistors including both p-type and n-type transistors. For example, source/drain regions 501, 502 and 503 of n-type nanosheet transistors may be epitaxially formed to include, for example, phosphorus ions through ion implantation and source/drain regions 511 and 512 of p-type transistors may be epitaxially formed to include, for example, boron ions through ion implantation as well.

After epitaxially forming the n-type source/drain regions 501, 502, and 503 and p-type source/drain regions 511 and 512 of nanosheet transistors, embodiments of present invention provide depositing an interlevel dielectric (ILD) layer 601 on top of and covering the formed source/drain regions in between the gate metals. Next, gate-cut trench isolations 611 and 612 may be formed in the ILD layer 601 that cut a gate metal into multiple gates for multiple transistors wherever it is necessary.

Figure 9A:
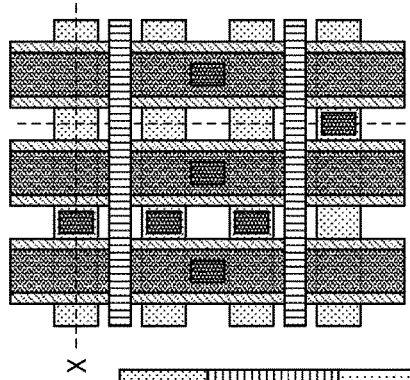
Figure 9B:
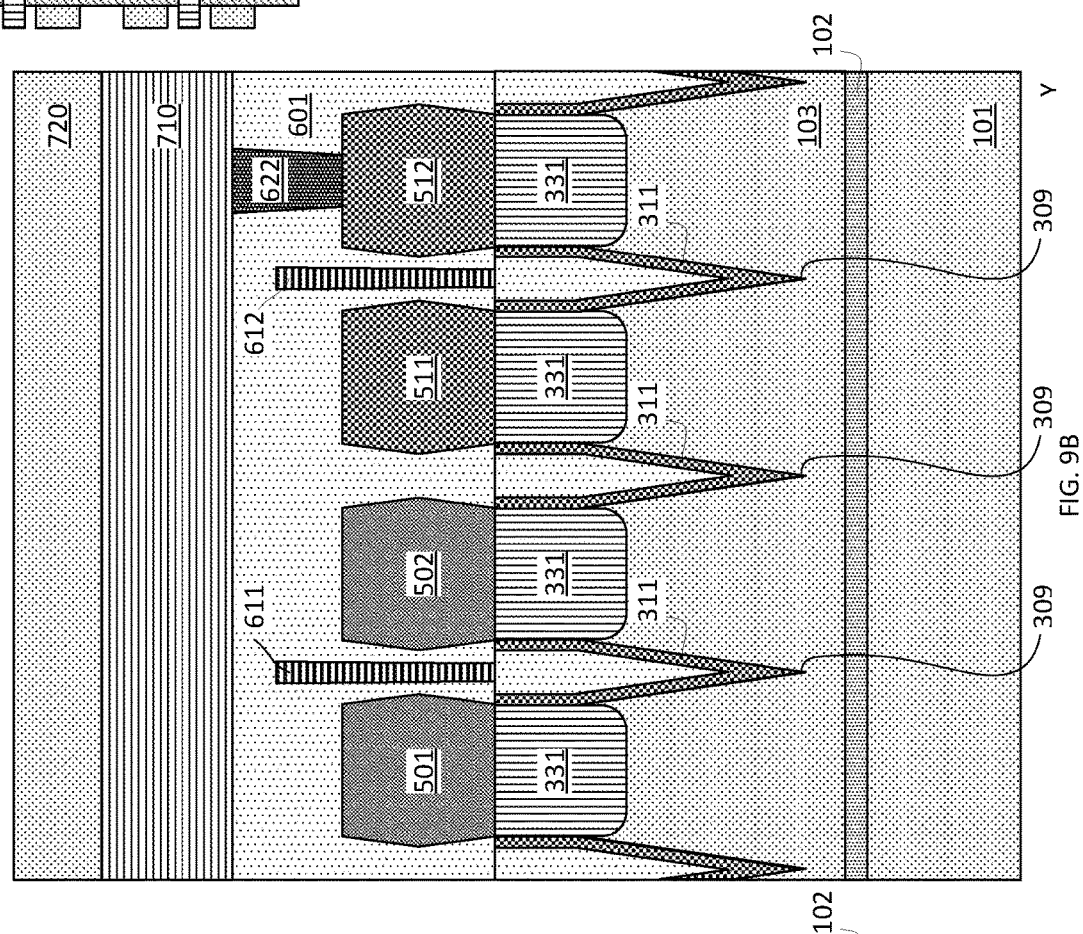
Figure 9C:
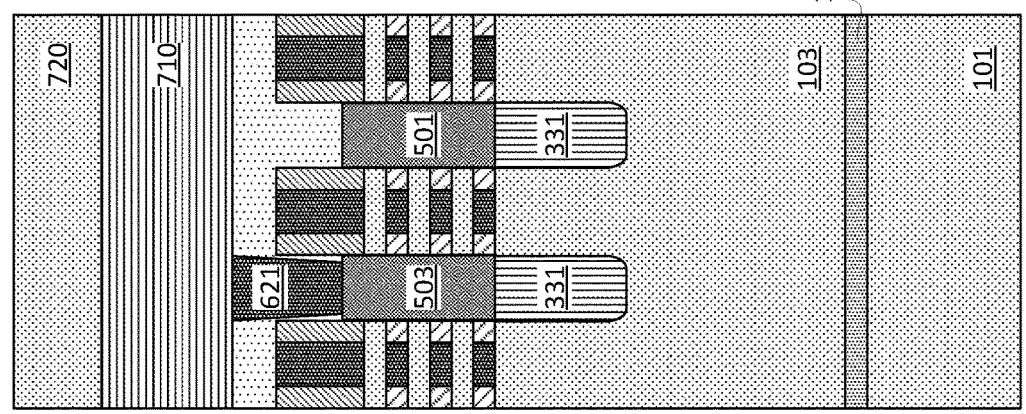

FIGS. 9A, 9B, and 9C are demonstrative illustrations of different cross-sectional views and a simplified top view of the semiconductor structure 10 in a step of manufacturing thereof according to one embodiment of present invention. Following the step illustrated in FIGS. 8A, 8B, and 8C, embodiments of present invention provide depositing an additional dielectric layer on top of the dielectric layer 601 and the gate metals; and forming one or more frontside contacts, such as a first and a second frontside contact 621 and 622, in the ILD layer 601 that contact the source/drain regions of the nanosheet transistors. For example, the first frontside contact 621 may contact the source/drain region 503 of a n-type transistor and the second frontside contact 622 may contact the source/drain region 512 of a p-type transistor, both from the frontside of the semiconductor structure 10.

After forming the frontside contacts 621 and 622, a back-end-of-line (BEOL) structure 710, including interconnect structures, may be formed on top of the ILD layer 610 and the frontside contacts 621 and 622. A carry wafer 720 may subsequently be bonded to or attached to the BEOL structure 710 such that the semiconductor structure 10 may be flipped upside-down for further processing from the backside of the semiconductor substrate 100, although upside-up (instead of upside-down) drawings will continue to be used hereinafter for consistency and ease of illustration.

Figure 10C:
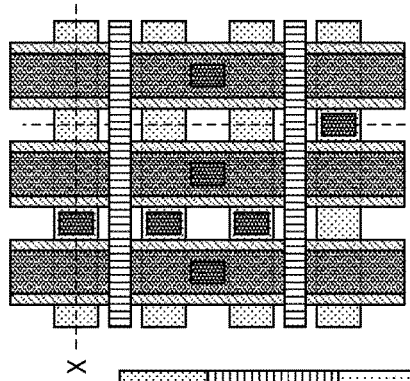
Figure 10B:
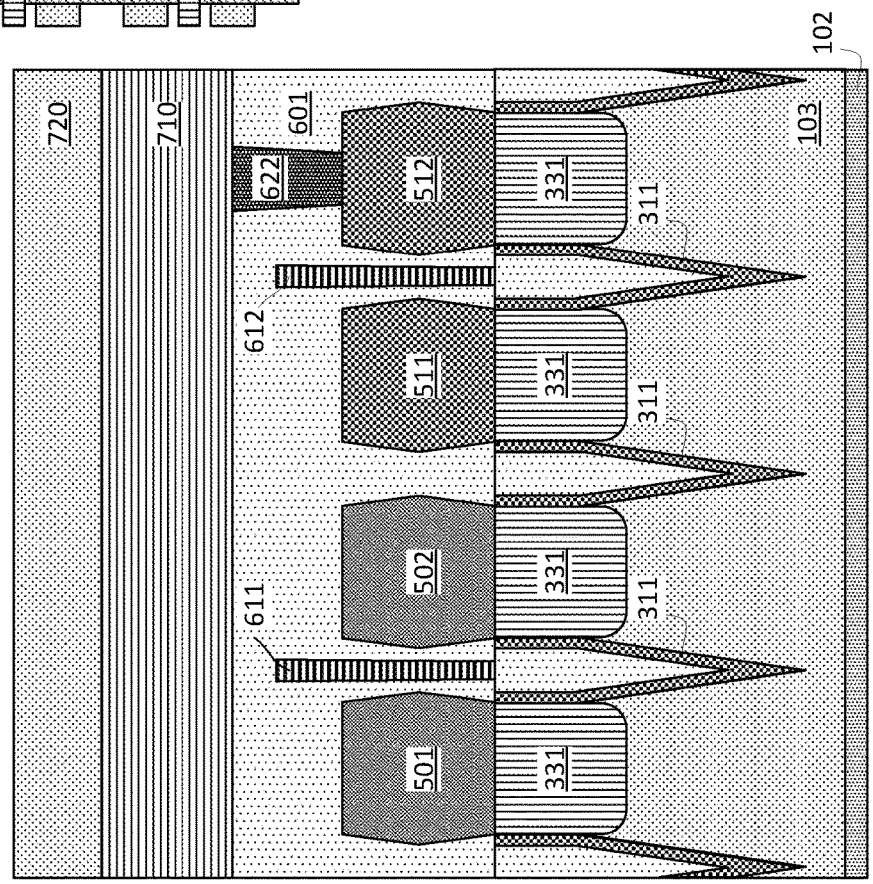
Figure 10A:
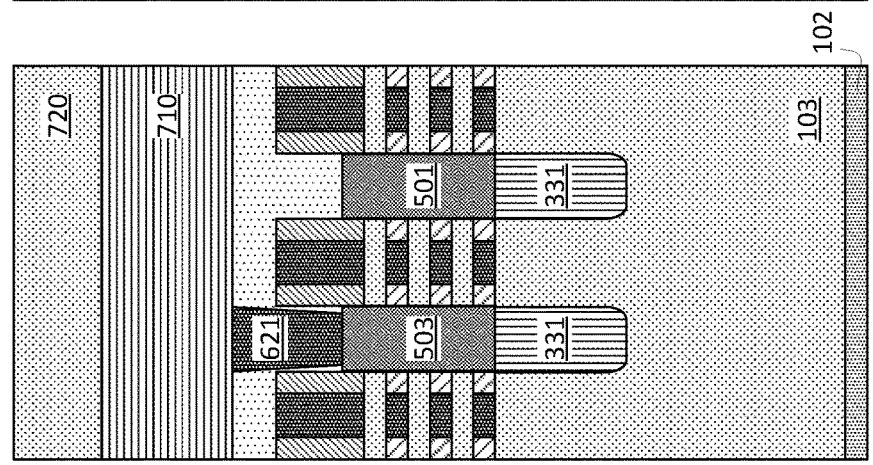

FIGS. 10A, 10B, and 10C are demonstrative illustrations of different cross-sectional views and a simplified top view of the semiconductor structure 10 in a step of manufacturing thereof according to one embodiment of present invention. Following the step illustrated in FIGS. 9A, 9B, and 9C, embodiments of present invention provide removing the Si substrate 101 through, for example, a CMP process, a grinding process, and/or other selective etching process. The removal of the Si substrate 101 may stop at the SiGe layer 102 which may be there for the purpose of assisting the removal of the Si substrate 101. For this reason, the SiGe layer 102 may be known or function as an etch-stop layer.

Figure 11C:
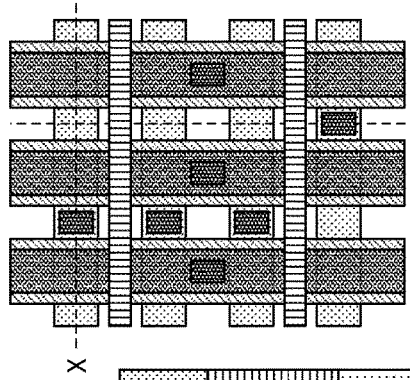
Figure 11B:
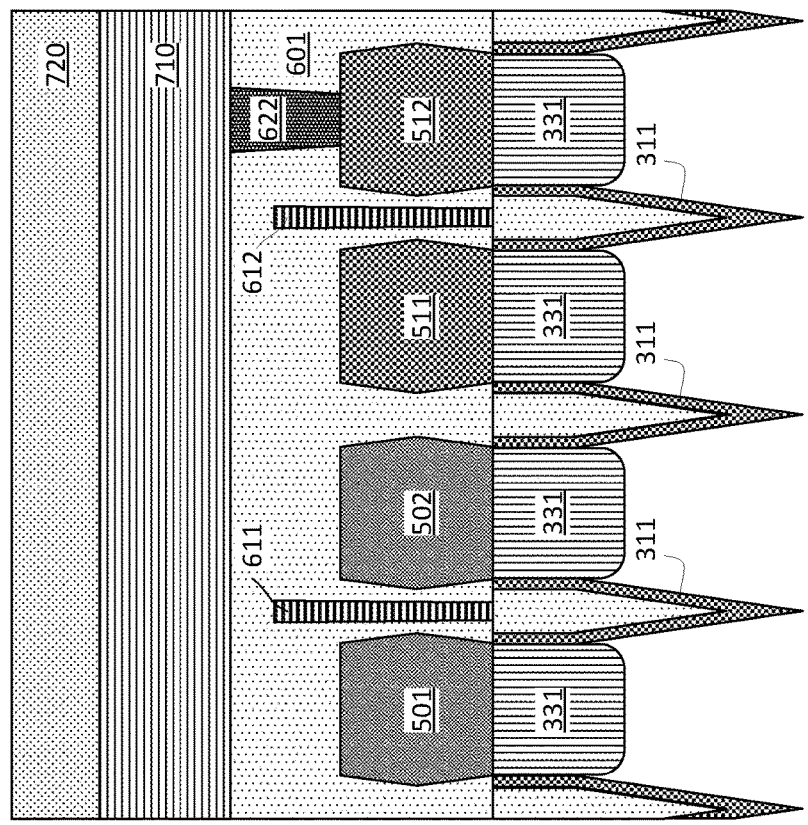
Figure 11A:
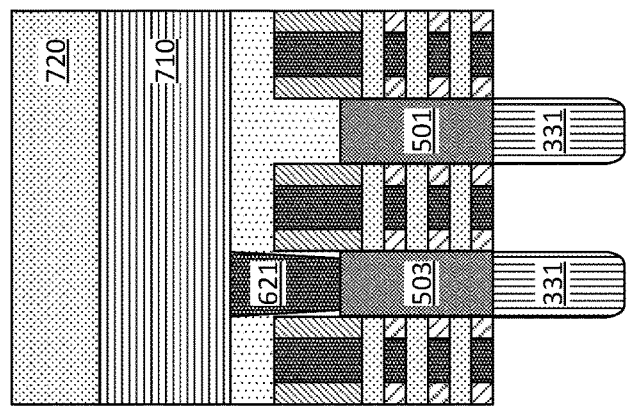

FIGS. 11A, 11B, and 11C are demonstrative illustrations of different cross-sectional views and a simplified top view of the semiconductor structure 10 in a step of manufacturing thereof according to one embodiment of present invention. Following the step illustrated in FIGS. 10A, 10B, and 10C, embodiments of present invention provide removing the SiGe layer 102 and the Si layer 103 that surrounds the trench isolations 300 and above the multiple placeholders 331 (note the structure is flipped upside-down). The Si layer 103 may be selectively removed by strategically applying etch selectivity between the multiple placeholders 331, which are made of SiGe, and the trench isolations 300 that are made of a dielectric filler 312 of for example $SiO_2$ surrounded by a dielectric liner 311 of for example SiN, both of which are materially different from the material of the Si layer 103, thus having different etch rate.

Figure 12A:
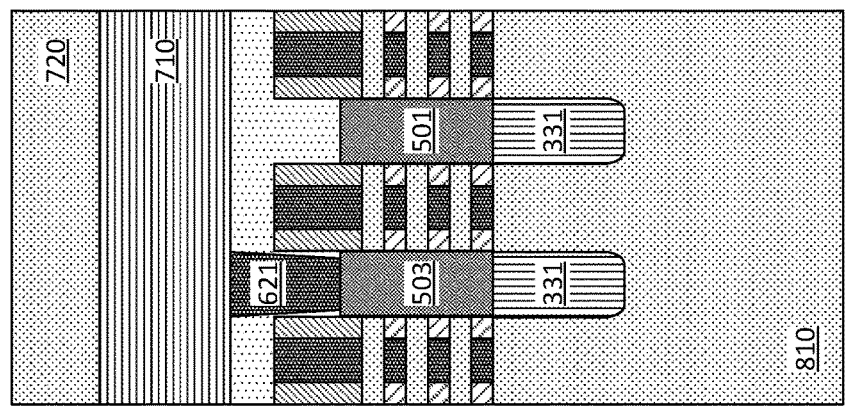
Figure 12B:
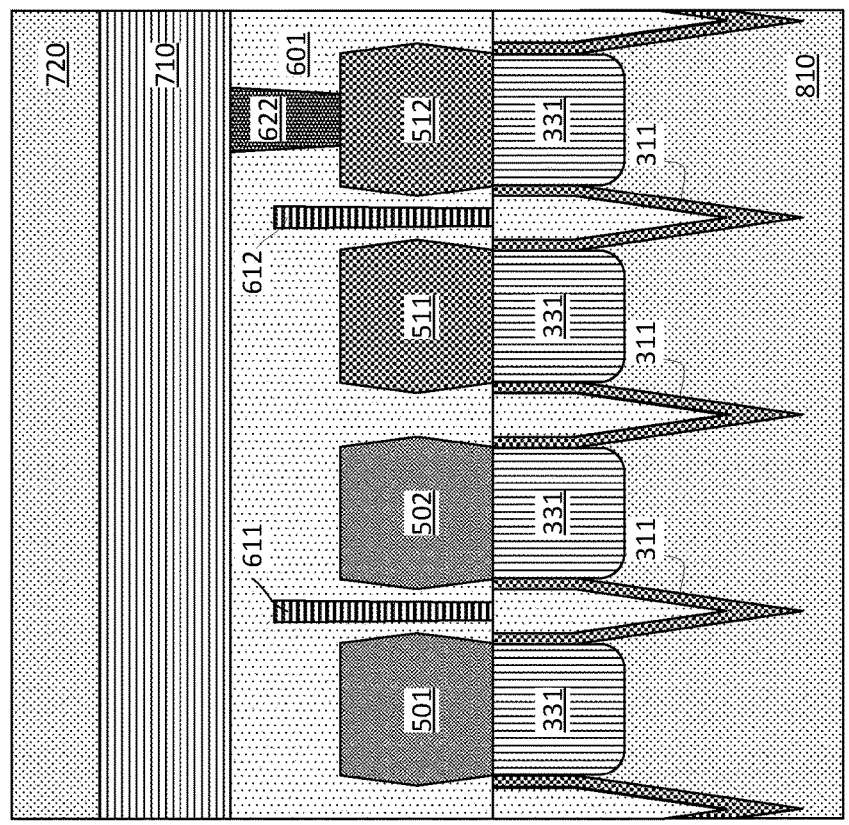
Figure 12C:
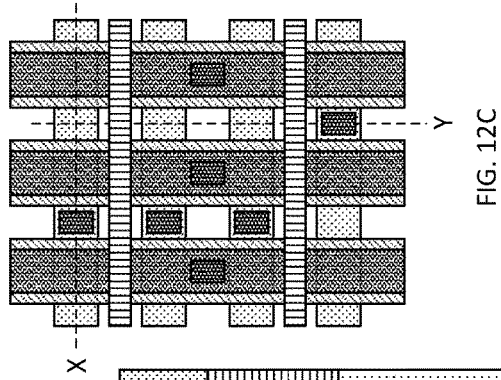

FIGS. 12A, 12B, and 12C are demonstrative illustrations of different cross-sectional views and a simplified top view of the semiconductor structure 10 in a step of manufacturing thereof according to one embodiment of present invention. Following the step illustrated in FIGS. 11A, 11B, and 11C, embodiments of present invention provide depositing a dielectric layer 810 such as, for example, a silicon-oxide ($SiO_2$) on top of (note the structure is flipped upside-down) and/or surrounding the multiple placeholders 331 and the trench isolations 300. The dielectric layer 810 may be sufficiently deep such that the pointy bottoms 319 of the trench isolations 300 may become embedded in the dielectric layer 810.

Figure 13C:
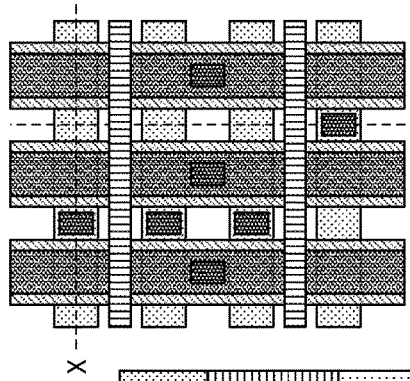
Figure 13B:
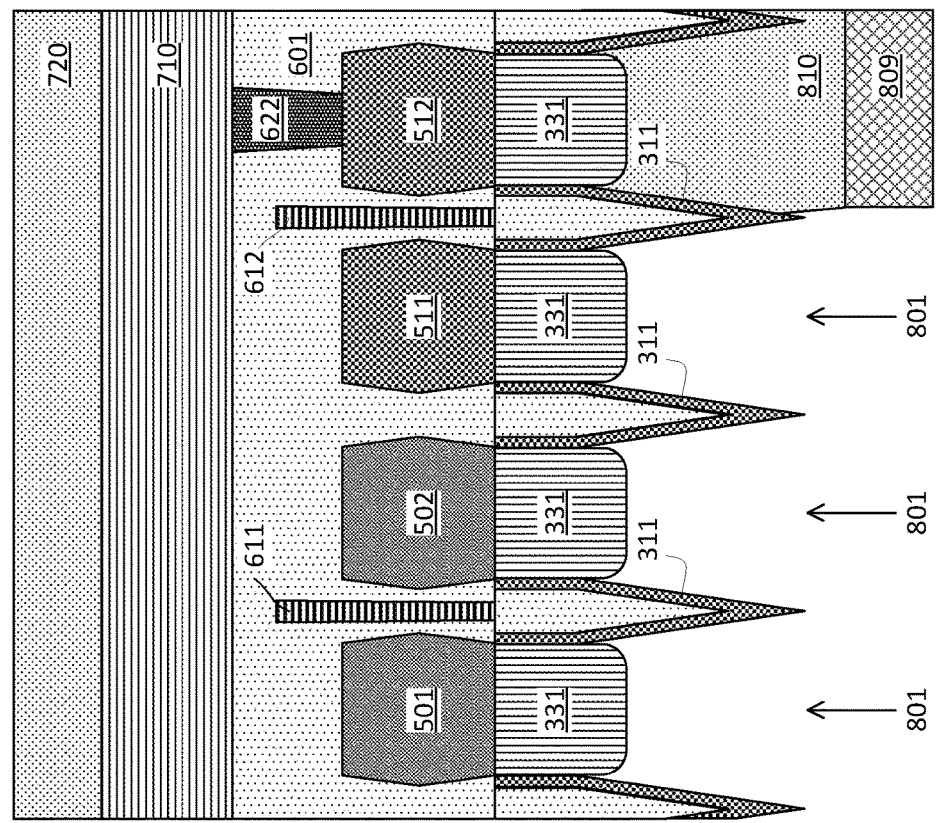
Figure 13A:
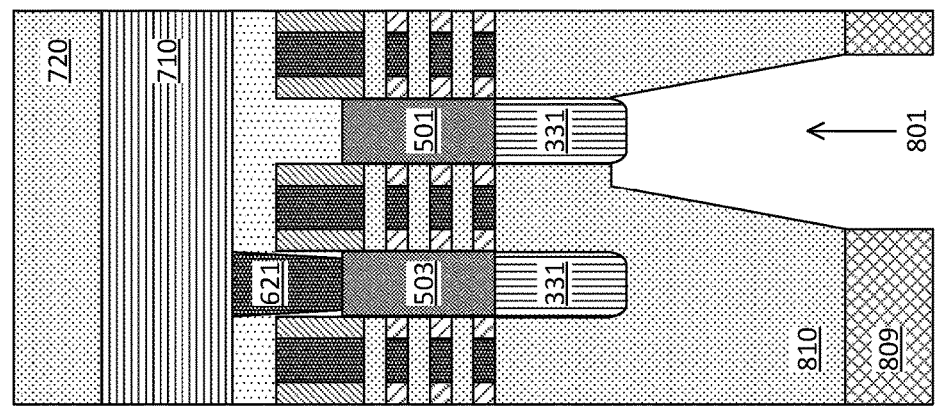

FIGS. 13A, 13B, and 13C are demonstrative illustrations of different cross-sectional views and a simplified top view of the semiconductor structure 10 in a step of manufacturing thereof according to one embodiment of present invention. Following the step illustrated in FIGS. 12A, 12B, and 12C, embodiments of present invention provide creating one or more openings such as, for example, multiple first openings 801 in the dielectric layer 810. Creation of the multiple first openings 801 may be made by first forming a hard mask 809 on top of the dielectric layer 810; patterning the hard mask 809 through a lithographic patterning process; and subsequently transferring the pattern of the hard mask 809 into the dielectric layer 810 to selectively remove a portion of the dielectric layer 810. The creation of the multiple first openings 801 may leave some of the placeholders 331 and the trench isolations 300 exposed.

In one embodiment, the multiple first openings may expose the contour of at least a lower portion of the trench isolations 300. In other words, the removal of the dielectric layer 810 may be self-aligned to the trench isolations 300, thereby help facilitating forming self-aligned backside contacts. In one embodiment, as is illustrated in FIG. 13B, a cross-sectional view of the first openings 801 may have a trapezoidal shape having an upper base and a lower base and the upper base of the trapezoidal shape is narrower than the lower base of the trapezoidal shape.

Figure 14C:
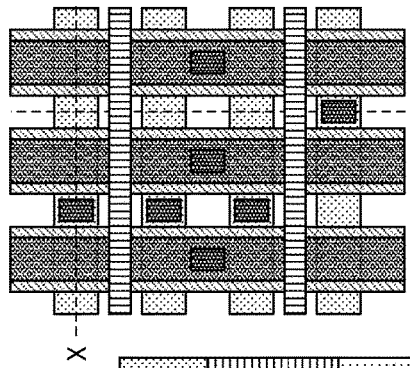
Figure 14B:
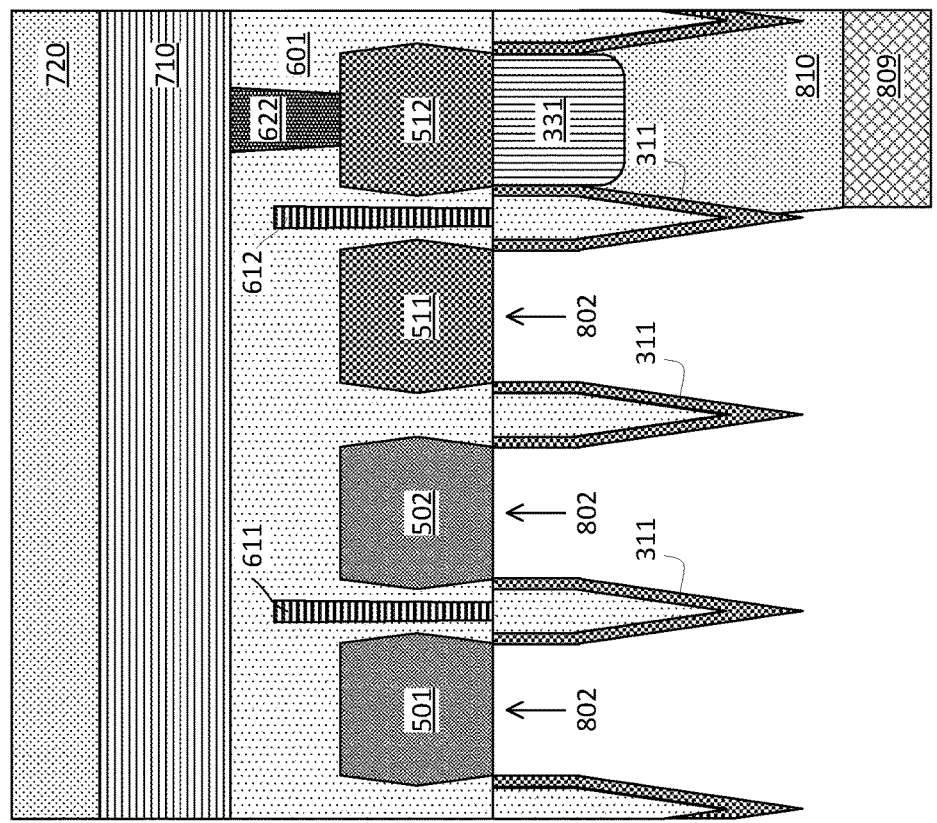
Figure 14A:
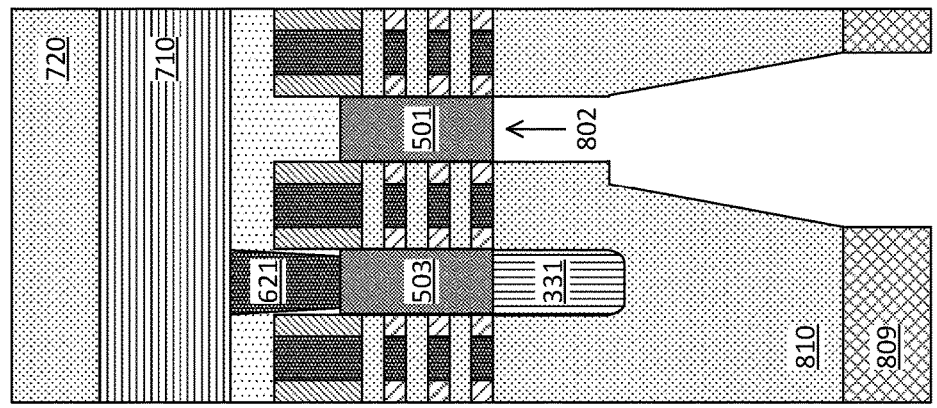

FIGS. 14A, 14B, and 14C are demonstrative illustrations of different cross-sectional views and a simplified top view of the semiconductor structure 10 in a step of manufacturing thereof according to one embodiment of present invention. Following the step illustrated in FIGS. 13A, 13B, and 13C, embodiments of present invention provide removing the exposed placeholders 331, selective to the exposed trench isolations 300, until bottom surfaces of the source/drain regions such as the source/drain regions 501, 502, and 511 of the nanosheet transistors are exposed. The removal of the placeholders 331 may create multiple second openings 802 in the places of the placeholders, which upwardly extend from the multiple first openings 801 respectively.

Figure 15C:
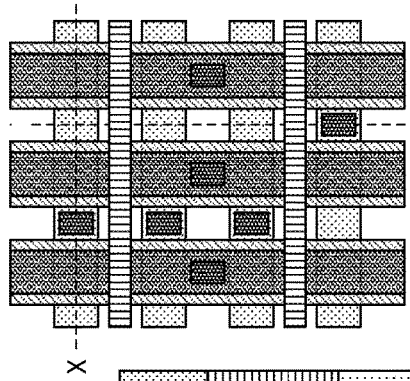
Figure 15B:
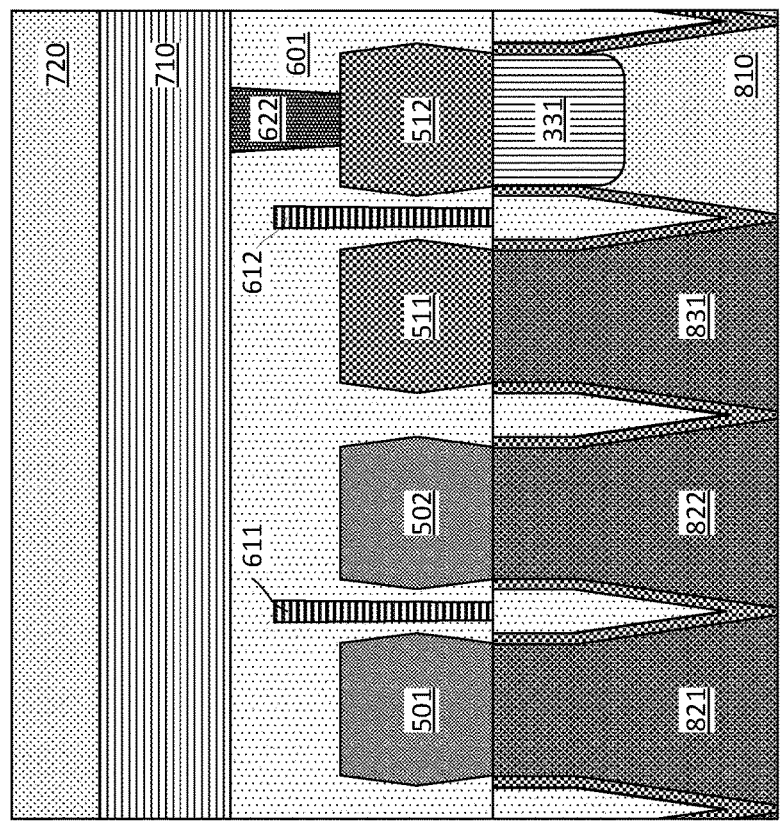
Figure 15A:
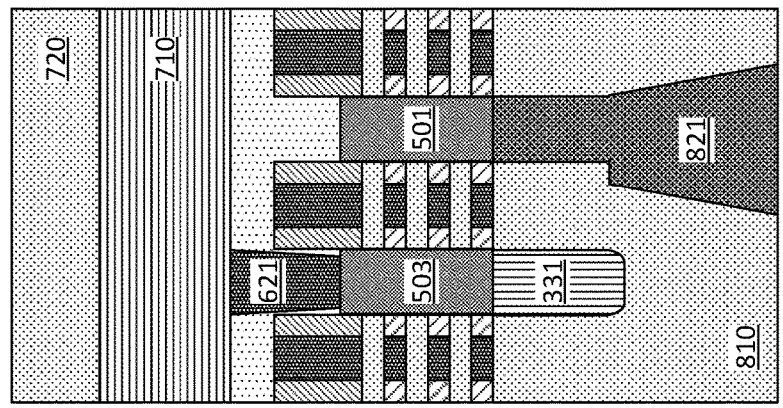

FIGS. 15A, 15B, and 15C are demonstrative illustrations of different cross-sectional views and a simplified top view of the semiconductor structure 10 in a step of manufacturing thereof according to one embodiment of present invention. Following the step illustrated in FIGS. 14A, 14B, and 14C, embodiments of present invention provide depositing a conductive material in the openings 801 and 802 to form one or more backside contacts such as backside contacts 821, 822, and 831. The backside contacts 821, 822, and 831 may follow the contour of the trench isolations 300 with a wider contact surface at the bottom, which helps facilitate forming contacts with one or more backside power rails as being described below in more details. In the meantime, the trench isolations 300, with their tapered or pointy lower portion, helps the backside contacts 821, 822, and 831 to be self-aligned with their respective source/drain regions 501, 502, and 511 of the respective nanosheet transistors. In the meantime, the trench isolation 300 properly insulates adjacent backside contacts 821, 822, and 831 from shorting each other.

Figure 16C:
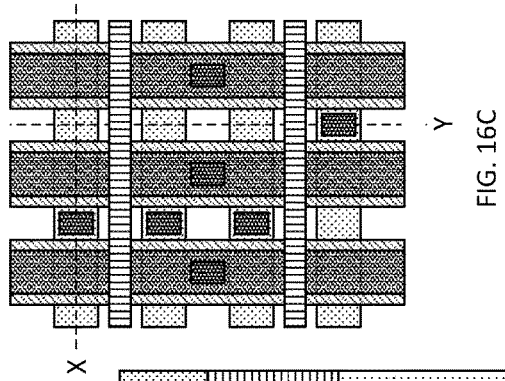
Figure 16B:
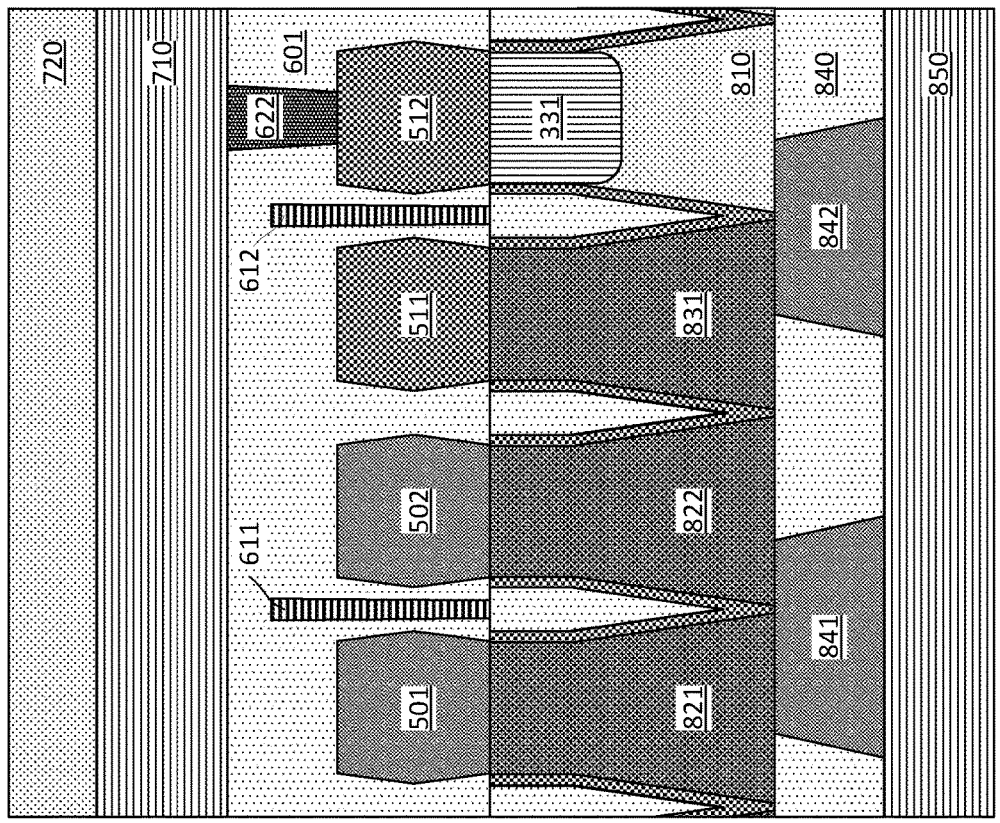
Figure 16A:
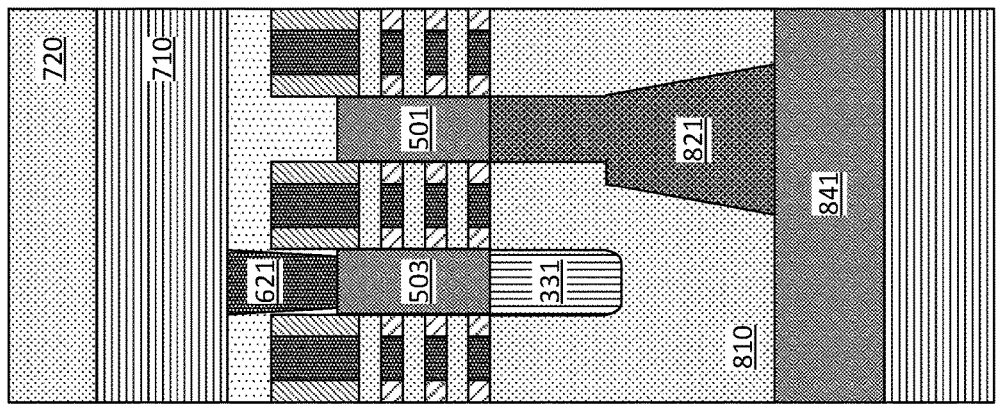

FIGS. 16A, 16B, and 16C are demonstrative illustrations of different cross-sectional views and a simplified top view of the semiconductor structure 10 in a step of manufacturing thereof according to one embodiment of present invention. Following the step illustrated in FIGS. 15A, 15B, and 15C, embodiments of present invention provide depositing a backside interlevel dielectric (BILD) layer 840 on top of and covering the backside contacts and subsequently forming one or more backside power rail (BSPR) structures, in the BILD layer 840, that are in contact with the one or more of the backside contacts. For example, a BSPR 841 may be formed directly underneath one of the trench isolations 300 to be both on a first (left) side and on a second (right) side of the trench isolation 300, and in contact with both the backside contact 821 and the backside contact 822, which in-turn are in contact with the first source/drain region 501 of the first transistor and the second source/drain region 502 of the second transistor. In one embodiment, the first and the second transistor are a same type of transistor such as both are an n-type transistor or a p-type transistor. Further for example, a BSPR 842 maybe formed to be in contact with the backside contact 831 only. In one embodiment, the pointy bottoms of some of the trench isolations 300, such as for example the trench isolation 300 between the source/drain region 502 and the source/drain region 511, may be in contact with the BILD layer 840. Embodiments of present invention provide further forming a backside power distribution network (BSPDN) 850 on top of the BSPR 841 and 842 and the BILD layer 840.

Figure 17:
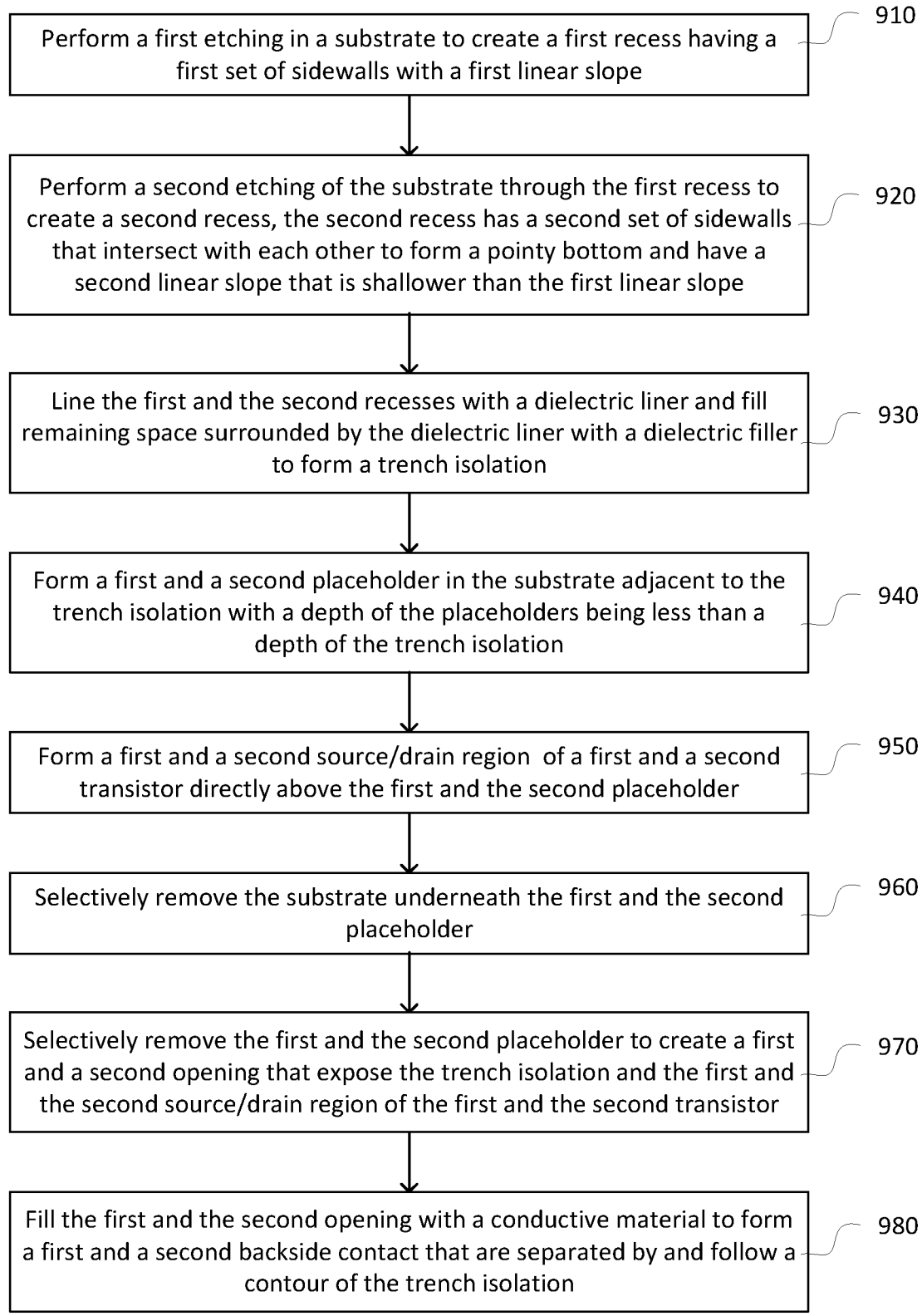
FIG. 17 is a demonstrative illustration of a flow-chart of a method of manufacturing a semiconductor structure according to embodiments of present invention.

FIG. 17 is a demonstrative illustration of a flow-chart of a method of manufacturing a semiconductor structure according to embodiments of present invention. The method includes (910) performing a first etching in a substrate to create a first recess having a first set of sidewalls with a first linear slope; (920) performing a second etching of the substrate through the first recess to create a second recess, the second recess has a second set of sidewalls that intersect with each other to form a pointy bottom and have a second linear slope that is shallower than the first linear slope; (930) lining the first and the second recesses with a dielectric liner and fill remaining space surrounded by the dielectric liner with a dielectric filler to form a trench isolation; (940) forming a first and a second placeholder in the substrate adjacent to the trench isolation with a depth of the placeholders being less than a depth of the trench isolation; (950) forming a first and a second source/drain region of a first and a second transistor directly above the first and the second placeholder; (960) selectively removing the substrate underneath the first and the second placeholder; (970) selectively removing the first and the second placeholder to create a first and a second opening that expose the trench isolation and the first and the second source/drain region of the first and the second transistor; and (980) filling the first and the second opening with a conductive material to form a first and a second backside contact that are separated by and follow a contour of the trench isolation.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
a trench isolation between a first source/drain region of a first transistor and a second source/drain region of a second transistor,
wherein the trench isolation includes an upper portion and a lower portion; the lower portion has a first lower sidewall and a second lower sidewall that intersects with the first lower sidewall to form a pointy bottom of the trench isolation; a first lower conformal liner at the first lower sidewall and a second lower conformal liner at the second lower sidewall; and the first lower conformal liner and the second lower conformal liner pinch off at the pointy bottom.

2. The semiconductor structure of claim 1, further comprising a first and a second backside contact directly connected to the first and the second source/drain region of the first and the second transistor respectively, the first and the second backside contact are formed directly next to the trench isolation to follow a contour of the trench isolation.

3. The semiconductor structure of claim 2, wherein the first backside contact includes a top portion and a bottom portion, the bottom portion has a trapezoidal shape with a narrow base at a top of the trapezoidal shape and a wider base at a bottom of the trapezoidal shape.

4. The semiconductor structure of claim 1, wherein the upper portion of the trench isolation has a first upper sidewall and a first upper conformal liner that respectively extend into the first lower sidewall and the first lower conformal liner, and a second upper sidewall and a second upper conformal liner that respectively extend into the second lower sidewall and the second lower conformal liner, wherein a linear slope of the first upper sidewall is steeper than a linear slope of the first lower sidewall and a linear slope of the second upper sidewall is steeper than a linear slope of the second lower sidewall.

5. The semiconductor structure of claim 4, wherein the first and second upper conformal liners and the first and second lower conformal liners are made of silicon-nitride (SiN) and the trench isolation further includes a dielectric filler of silicon-oxide ($SiO_2$) between the first and second upper conformal liners and between the first and second lower conformal liners.

6. The semiconductor structure of claim 5, further comprising a gate-cut trench directly above the trench isolation between the first and the second transistor, wherein the first and the second transistor are a same type of transistor.

7. The semiconductor structure of claim 6, further comprising a backside power rail (BSPR) directly below the trench isolation, the BSPR being connected to both the first and the second source/drain region of the first and the second transistor.

8. The semiconductor structure of claim 5, wherein the pointy bottom of the trench isolation is in contact with a backside interlevel dielectric (BILD) layer and the first transistor is a p-type transistor and the second transistor is an n-type transistor.

9. The semiconductor structure of claim 1, wherein the trench isolation has a depth ranging from about 30 nm to about 300 nm.

10. A semiconductor structure comprising:
a trench isolation between a first source/drain region of a first transistor and a second source/drain region of a second transistor,
wherein the trench isolation has a pointy bottom; includes a conformal liner at sidewalls of the trench isolation; and includes a dielectric filler between portions of the conformal liner at the sidewalls of the trench isolation, and
wherein the trench isolation has an upper portion and a lower portion, the upper portion has a first set of sidewalls with a first linear slope and the lower portion has a second set of sidewalls with a second linear slope, and the first linear slope is steeper than the second linear slope.

11. The semiconductor structure of claim 10, further comprising a first and a second backside contact directly connected to the first and the second source/drain region of the first and the second transistor respectively, the first and the second backside contact are aligned with the trench isolation to follow a contour of the trench isolation.

12. The semiconductor structure of claim 11, wherein the first backside contact includes a top portion and a bottom portion, the bottom portion has a trapezoidal shape with a narrow base at a top of the trapezoidal shape and a wider base at a bottom of the trapezoidal shape.

13. The semiconductor structure of claim 11, wherein the first and second transistors are a same type of transistor, and the trench isolation is directly above a backside power rail (BSPR) that is in contact with the first and the second backside contact.

14. The semiconductor structure of claim 11, wherein the first and second transistors are different types of transistors, and the trench isolation is directly above a backside interlevel dielectric (BILD) layer.

15. The semiconductor structure of claim 10, wherein the conformal liner is made of silicon-nitride (SiN); the dielectric filler is made of silicon-oxide ($SiO_2$); and the conformal liner has a thickness ranging from about 5 nm to about 20 nm.

16. A method comprising:
forming a trench isolation in a substrate;
forming a first and a second placeholder in the substrate adjacent to the trench isolation, wherein the first and the second placeholder have a depth less than a depth of the trench isolation;
forming a first and a second source/drain region of a first and a second transistor directly above the first and the second placeholder respectively;
selectively removing the substrate underneath the first and the second placeholder;
selectively removing the first and the second placeholder to create a first and a second opening that expose the first and the second source/drain region of the first and the second transistor and expose the trench isolation; and
filling the first and the second opening with a conductive material to form a first and a second backside contact that follow a contour of the trench isolation.

17. The method of claim 16, wherein forming the trench isolation comprises:

performing a first etching of the substrate to create a first recess having a first set of sidewalls with a first linear slope;

performing a second etching of the substrate, through the first recess, to create a second recess below the first recess, the second recess having a second set of sidewalls extended from the first set of sidewalls, the second set of sidewalls having a second linear slope and intersecting with each other to form a pointy bottom of the second recess.

18. The method of claim 17, wherein forming the trench isolation further comprises depositing a conformal liner lining the first and the second recesses, resulting the conformal liner to pinch off at the pointy bottom of the second recess.

19. The method of claim 16, further comprising forming a backside power rail (BSPR) in contact with the first and the second backside contact at a first side and a second side of the trench isolation, the BSPR being directly underneath the trench isolation and being formed from a backside of the substrate.

* * * * *